(12) United States Patent
Chen et al.

(10) Patent No.: US 11,921,318 B2
(45) Date of Patent: Mar. 5, 2024

(54) SEMICONDUCTOR STRUCTURE AND METHOD OF FORMING THE SAME

(71) Applicants: Semiconductor Manufacturing International (Shanghai) Corporation, Shanghai (CN); Semiconductor Manufacturing International (Beijing) Corporation, Beijing (CN)

(72) Inventors: Xiaojun Chen, Shanghai (CN); Honglin Zeng, Shanghai (CN); Xia Feng, Shanghai (CN); Dongsheng Zhang, Shanghai (CN); Xiage Yin, Shanghai (CN); Jiaheng Wu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 17/742,974

(22) Filed: May 12, 2022

(65) Prior Publication Data

US 2022/0365275 A1 Nov. 17, 2022

(30) Foreign Application Priority Data

May 13, 2021 (CN) .......................... 202110523253.7

(51) Int. Cl.
G02B 6/124 (2006.01)
G02B 6/12 (2006.01)
G02B 6/13 (2006.01)

(52) U.S. Cl.
CPC ......... *G02B 6/12004* (2013.01); *G02B 6/124* (2013.01); *G02B 6/13* (2013.01); *G02B 2006/12061* (2013.01)

(58) Field of Classification Search
CPC ........... G02B 2006/12173; G02B 2006/12176; G02B 2006/12178; G02B 6/124
See application file for complete search history.

(56) References Cited

U.S. PATENT DOCUMENTS

| 9,957,572 B2 * | 5/2018 | Vogelstein | ........... C12Q 1/6886 |
| 2003/0003735 A1 * | 1/2003 | Deliwala | ............ G02B 6/12004 |
| | | | 438/689 |
| 2013/0015546 A1 * | 1/2013 | Joe | ..................... G02B 6/12002 |
| | | | 257/E31.127 |
| 2020/0310027 A1 * | 10/2020 | Boeuf | .................... G02B 6/136 |

* cited by examiner

*Primary Examiner* — Charlie Y Peng
(74) *Attorney, Agent, or Firm* — Anova Law Group, PLLC (57) ABSTRACT

A method of forming a semiconductor structure includes: providing an initial substrate having a first region and a second region; forming a first substrate on the initial substrate; forming a first insulating layer on the first substrate; forming a second substrate on the first insulating layer; removing the second substrate in the second region to form a second insulating layer on the first insulating layer in the second region; and forming a plurality of passive devices on the second insulating layer in the second region and forming a plurality of active devices on the second substrate in the first region.

19 Claims, 6 Drawing Sheets

SEMICONDUCTOR STRUCTURE AND METHOD OF FORMING THE SAME

CROSS-REFERENCE TO RELATED APPLICATION

This application claims priority to Chinese Patent Application No. 202110523253.7, filed on May 13, 2021, the entire content of which is incorporated herein by reference.

TECHNICAL FIELD

The present disclosure relates to the technical field of semiconductor fabrication technologies and, more particularly, to a semiconductor structure and a method of forming the semiconductor structure.

BACKGROUND

As the very large-scale integrated circuits (VLSIs) continuously advance toward "faster, smaller, lighter, and cheaper", areas occupied by chips continue to decrease with process advancements.

Currently, integrated passive device (IPD) technology is widely used to integrate large-area passive devices on separate chips, and then passive devices and active devices are integrated together through packaging. To a certain degree, this method pushes the chips toward miniaturization.

However, there are still problems in the existing technology to form and integrate the passive devices and the active devices in a same packaged structure.

SUMMARY

The present disclosure provides a semiconductor structure and a method of forming the same, which can effectively reduce a thickness of the semiconductor structure and can lower production cost.

One aspect of the present disclosure provides a semiconductor structure. The semiconductor structure includes: a substrate having a first region and a second region; a first insulating layer on the substrate; a second insulating layer on the first insulating layer in the second region; a plurality of active devices on the first insulating layer in the first region; and a plurality of passive devices on the second insulating layer.

Optionally, the semiconductor structure further includes: a third insulating layer on the plurality of passive devices; a fourth insulating layer on the plurality of active devices, a top surface of the fourth insulating layer being leveled with a top surface of the third insulating layer; and a fifth insulating layer on the third insulating layer and the fourth insulating layer.

Optionally, the semiconductor structure further includes: a grating layer in the third insulating layer.

Optionally, the semiconductor structure further includes: an electrical interconnection structure connecting to an active device of the plurality active devices.

Optionally, the semiconductor structure further includes: a passivation layer on the fifth insulating layer; a first light inlet passing through the passivation layer and over the plurality of active devices; and a second light inlet passing through the passivation layer, the fifth insulating layer, and the third insulating layer, and over the plurality of passive devices.

Optionally, the plurality of passive devices is made of a material based on silicon nitride; and/or the plurality of active devices is made of a material based on silicon.

Optionally, the plurality of active devices includes at least one of a modulator or a detector; and/or the plurality of passive devices includes a waveguide device.

Another aspect of the present disclosure provides a method of forming a semiconductor structure. The method includes: providing an initial substrate having a first region and a second region; forming a first substrate on the initial substrate; forming a first insulating layer on the first substrate; forming a second substrate on the first insulating layer; removing the second substrate in the second region to form a second insulating layer on the first insulating layer in the second region; and forming a plurality of passive devices on the second insulating layer in the second region and forming a plurality of active devices on the second substrate in the first region.

Optionally, forming the plurality of passive devices includes: forming a passive device material layer on the second insulating layer; performing a first patterning process on the passive device material layer for multiple times to form a plurality of initial passive devices; and performing an annealing process on the plurality of initial passive devices to form the plurality of passive devices. An annealing temperature in the annealing process is higher than 1000° C.

Optionally, the plurality of passive devices is made of a material based on silicon nitride, and/or the second substrate is made of a material based on silicon.

Optionally, the plurality of active devices includes at least one of a modulator or a detector.

Optionally, forming the plurality of active devices includes: forming a plurality of device structures in the first region; and performing an ion injection process in the first region for multiple times.

Optionally, the plurality of device structures includes at least one of a gate structure or an epitaxial layer in the second substrate.

Optionally, while forming the plurality of initial passive devices, the method of forming the semiconductor structure further includes: forming a plurality of barrier layers on the plurality of device structures.

Optionally, the ion injection process includes: forming a third insulating layer on the plurality of passive devices and the plurality of barrier layers; removing a portion of the third insulating layer and the plurality of barrier layers to form a processing opening in the third insulating layer, the processing opening being over the plurality of device structures; and injecting ions into the plurality of device structures to form the plurality of active devices.

Optionally, the third insulating layer includes a grating layer.

Optionally, after the plurality of active devices is formed, the method of forming the semiconductor structure further includes: forming an electrical interconnection structure over the plurality of active devices.

Optionally, after the plurality of active devices is formed, the method of forming the semiconductor structure further includes: forming a fourth insulating layer on the plurality of active devices, a top surface of the fourth insulating layer being leveled with a top surface of the third insulating layer; and forming a fifth insulating layer on the third insulating layer and the fourth insulating layer, the electrical interconnection structure being in the fourth insulating layer and the fifth insulating layer.

Optionally, after the plurality of active devices is formed, the method of forming the semiconductor structure further includes: forming a passivation layer on the fifth insulating layer; forming a first light inlet passing through the passivation layer, the first light inlet being over the plurality of active devices; and forming a second light inlet passing through the passivation layer, the fifth insulating layer, and the third insulating layer, the second light inlet being over the plurality of passive devices.

Optionally, forming the second light inlet includes: removing a portion of the passivation layer, the fifth insulating layer, and the third insulating layer to form the second light inlet.

Compared with the existing technology, the technical solution of the present disclosure includes the following advantages.

The structure of the technical solution of the present disclosure includes the plurality of active devices and the plurality of passive devices on the second insulating layer. Through forming the plurality of active devices and the plurality of passive devices on the same wafer, the process of packaging integration is avoided, the production cost is effectively reduced, and the thickness and size of the formed semiconductor structure are reduced, which facilitates the miniaturization of the device.

Further, the plurality of passive devices is made of a material based on silicon nitride, and the plurality of active devices is made of a material based on silicon. Thus, the optical propagation loss of the plurality of active devices and the plurality of passive devices is reduced.

Further, the third insulating layer includes the grating layer therein. According to the application requirements of the device structure, if the grating layer is required, the grating layer is retained when the second light inlet is subsequently formed. If the grating layer is not required, the grating layer is used as an etch-stopping layer when the second light inlet is subsequently formed.

BRIEF DESCRIPTION OF THE DRAWINGS

To more clearly illustrate the technical solution of the present disclosure, the accompanying drawings used in the description of the disclosed embodiments are briefly described below. The drawings described below are merely some embodiments of the present disclosure. Other drawings may be derived from such drawings by a person with ordinary skill in the art without creative efforts and may be encompassed in the present disclosure.

DETAILED DESCRIPTION OF THE EMBODIMENTS

Embodiments of the present disclosure are described in detail below with reference to the accompanying drawings. It will be appreciated that the described embodiments are some rather than all of the embodiments of the present disclosure. Other embodiments obtained by those having ordinary skills in the art on the basis of the described embodiments without inventive efforts should fall within the scope of the present disclosure.

As mentioned in the background, there are still many problems in the existing technology for the formation and integration of passive devices and active devices in the same package. A specific description will be given below.

Most silicon photonic chips in the existing technology use a silicon wafer (or SOI wafer) on an insulating substrate, and the passive devices and the active devices can be completed on a silicon layer (Si) by a traditional CMOS process. However, a propagation loss of silicon is relatively high (~1-2 db/cm), and is not a good passive device material. Silicon nitride (SiN) has very low optical propagation loss (<0.2 db/cm), and is an excellent optical waveguide passive device material. But it is impossible to form the active devices on SiN. How to integrate characteristics of SOI and SiN on a same chip is a difficult task in the industry.

Now the industry commonly uses SOI for forming an active-device chip and SiN for forming a passive-device chip, and then integrates the two chips together through packaging. However, integrating the two chips through packaging not only requires a complicated manufacturing process, but also has a relatively high manufacturing cost. In addition, a thickness of an integrated chip formed through packaging will increase, which does not help the miniaturization of devices.

Based on the above description, the present disclosure provides a semiconductor structure and a method for forming the same. The semiconductor structure includes a substrate and a second insulating layer. The substrate includes a plurality of active devices, and a plurality of passive devices is formed on the second insulating layer. By forming the active devices and the passive devices on a same wafer, a packaging integration process can be avoided, production cost can be effectively reduced, and the thickness and size of the formed semiconductor structure are reduced, thereby facilitating the miniaturization of the devices.

To make the above objectives, features and advantages of the present disclosure more clearly understood, the embodiments of the present disclosure will be described in detail below with reference to the accompanying drawings.

The present disclosure provides a method of forming a semiconductor structure. FIG. 11 is a flowchart of an exemplary method of forming a semiconductor structure according to some embodiments of the present disclosure. FIGS. 1-10 are schematic structural diagrams illustrating various steps of an exemplary method of forming a semiconductor structure according to some embodiments of the present disclosure. As shown in FIG. 11, the method includes the following processes.

At S1101, an initial substrate having a first region and a second region is provided.

At S1102, a first substrate is formed on the initial substrate.

At S1103, a first insulating layer is formed on the first substrate.

At S1104, a second substrate is formed on the first insulating layer.

Figure 1:
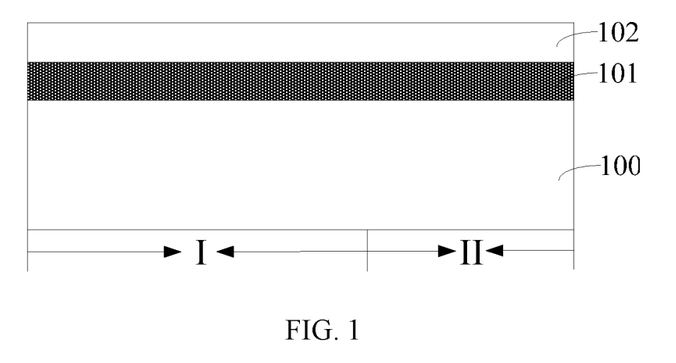
FIGS. 1-10 are schematic structural diagrams illustrating various steps of an exemplary method of forming a semiconductor structure according to some embodiments of the present disclosure.

Referring to FIG. 1, an initial substrate is provided. The initial substrate includes a first region I and a second region II. The initial substrate includes a first substrate 100, a first insulating layer 101 disposed on the first substrate 100, and a second substrate 102 disposed on the first insulating layer 101.

In some embodiments, the initial substrate is a silicon-on-insulator (SOI).

In some embodiments, the first substrate 100 and the second substrate 102 are made of a material based on silicon.

In some embodiments, the first insulating layer 101 is made of a material based on silicon oxide.

Referring back to FIG. 11, at S1105, the second substrate in the second region is removed to form a second insulating layer on the first insulating layer in the second region. At S1106, a plurality of passive devices is formed on the second insulating layer, and after the plurality of passive devices is formed, a plurality of active devices is formed in the first region.

After the initial substrate is provided, the method further includes: removing the second substrate 102 in the second region II; after removing the second substrate 102 in the second region, forming a second insulating layer on the first insulating layer 101 in the second region II; forming a plurality of passive devices on the second insulating layer; and after the plurality of passive devices is formed, forming a plurality of active devices in the first region I. For specifics of the above formation process, references can be made to FIGS. 2-7.

Figure 2:
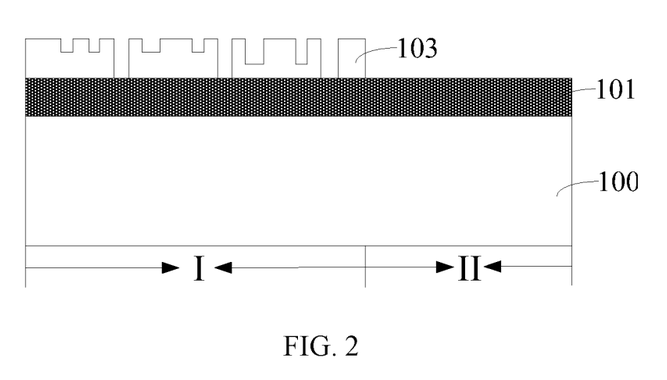

Referring to FIG. 2, a plurality of device structures 103 is formed in the first region I.

In some embodiments, after the plurality of device structures 103 is formed in the first region I, the initial substrate is formed into a substrate.

In some embodiments, forming the plurality of device structures 103 includes: performing a second patterning process on the second substrate 102 in the first region I for multiple times to form the plurality of device structures 103.

In some embodiments, the second substrate 102 in the second region II is removed while the second patterning process is performed on the second substrate 102 in the first region I for the multiple times.

In some embodiments, the plurality of device structures 103 is a passive device.

In some embodiments, the plurality of device structures 103 includes at least one of a gate structure or an epitaxial layer in the second substrate 102.

Figure 3:
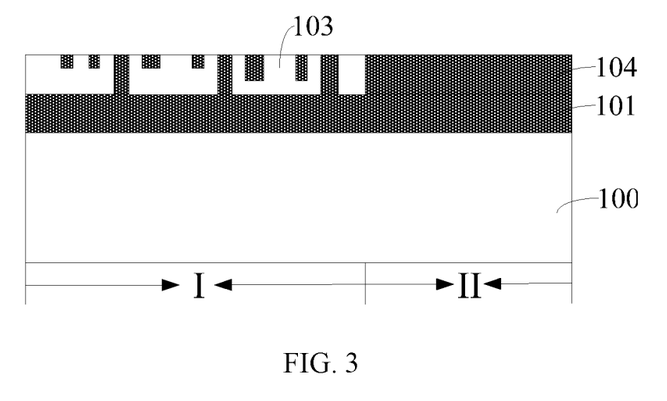

Referring to FIG. 3, after the plurality of device structure 103 is formed, a second insulating layer 104 is formed on the first insulating layer 101 in the second region II.

In some embodiments, forming the second insulating layer 104 includes: forming an initial second insulating layer (not shown) on the first insulating layer 101 in the second region II and over the plurality of device structures 103 to cover the plurality of device structures 103; and planarizing the initial second insulating layer to form the second insulating layer 104.

In some embodiments, the second insulating layer 104 is made of a material based on silicon oxide.

In some embodiments, planarizing the initial second insulating layer includes a chemical mechanical polishing process.

Figure 4:
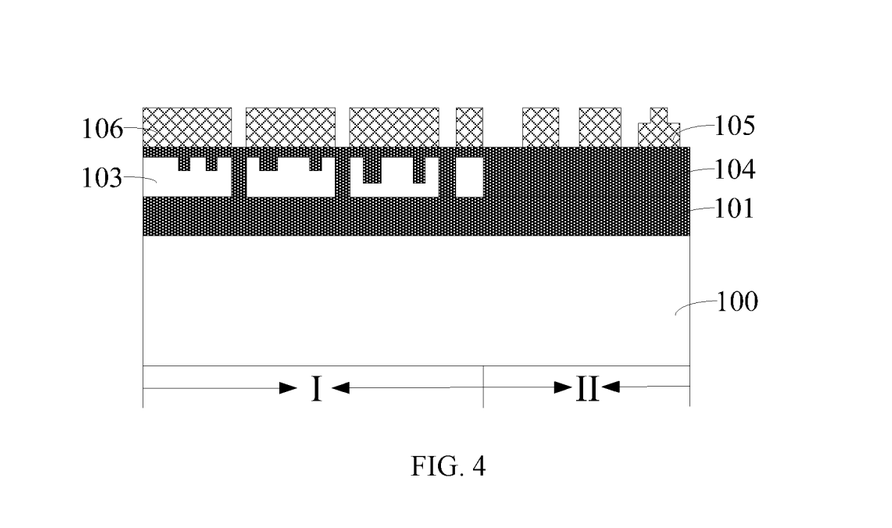

Referring to FIG. 4, the method further includes: after the second insulating layer 104 is formed, forming a passive device material layer on the second insulating layer 104; performing a first patterning process on the passive device material layer for multiple times to form an initial passive device; and annealing the initial passive device to form a passive device 105.

In some embodiments, the passive device material layer is made of a material based on silicon nitride. Because the silicon nitride has substantially low optical propagation loss (<0.2 db/cm), the silicon nitride is a suitable material for forming an optical waveguide passive device.

In some embodiments, an annealing process can reduce hydrogen ions in the passive device, thereby reducing light propagation loss.

In some embodiments, an annealing temperature of the annealing process is higher than 1,000° C.

In some embodiments, while forming the initial passive device, the method further includes: forming a plurality of sacrificial layers 106, on the plurality of device structures 103.

In some embodiments, the passive device 105 is a waveguide device.

Figure 5:
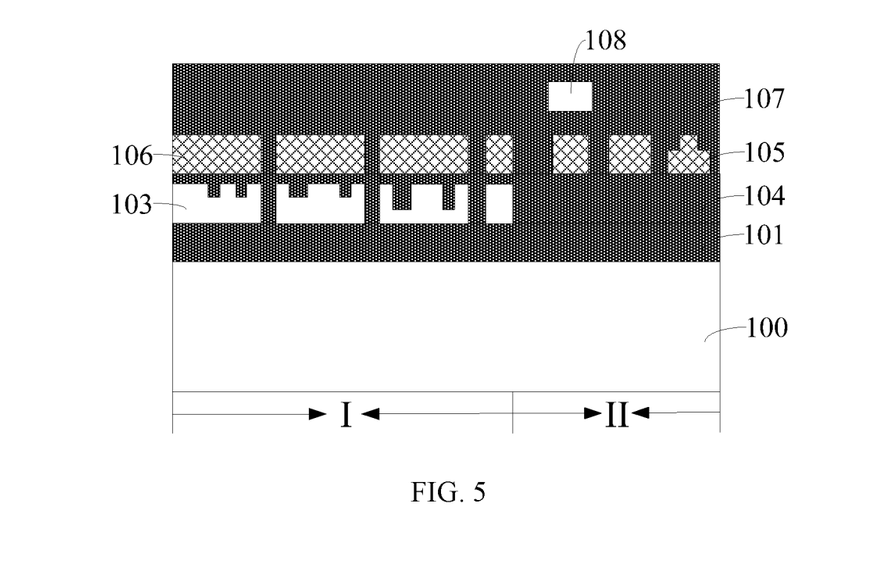

Referring to FIG. 5, after the passive device 105 is formed, the method further includes: forming a third insulating layer 107 on the passive device 105 and the plurality of sacrificial layers 106.

In some embodiments, the third insulating layer 107 is made of a material based on silicon oxide.

In some embodiments, forming the third insulating layer 107 in advance to cover the passive device 105 prevents a subsequent process of injecting ions into the plurality of device structure 103 from affecting the passive device 105 and impairing a function of the passive device 105.

In some embodiments, the third insulating layer 107 includes a grating layer 108 therein. In a subsequent process, the grating layer 108 can be selectively removed or retained according to requirements of device functions. If the grating layer 108 is selected to be removed, the grating layer 108 can also be used as an etch-stopping layer for a subsequent process of forming a second light inlet.

In some embodiments, the grating layer 108 is made of a material based on polysilicon.

Figure 6:
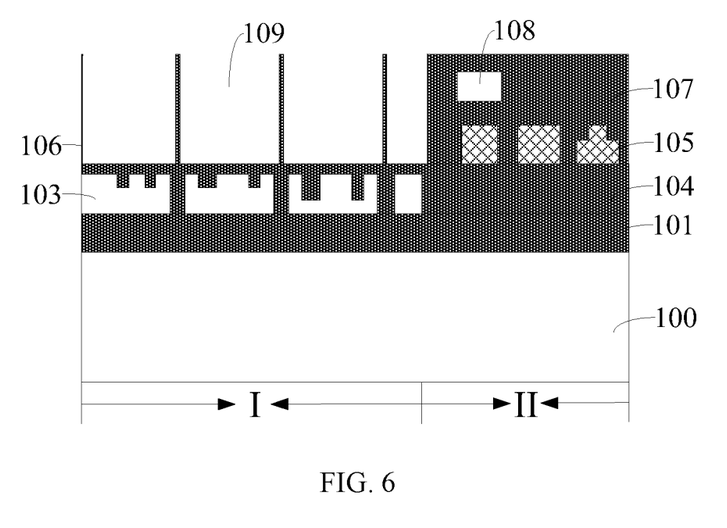

Referring to FIG. 6, after the third insulating layer 107 is formed, the method further includes: remove a portion of the third insulating layer 107 and the sacrificial layer 106; and forming a processing opening 109 in the third insulating layer 107. The processing opening 109 is over the plurality of deice structures 103.

In some embodiments, the processing opening 109 is formed to facilitate the subsequent process of injecting the ions into the plurality of device structure 103.

In some embodiments, the sacrificial layer 106 serves as the etch-stopping layer when the third insulating layer 107 is etched in the process of forming the processing opening 109.

Figure 7:
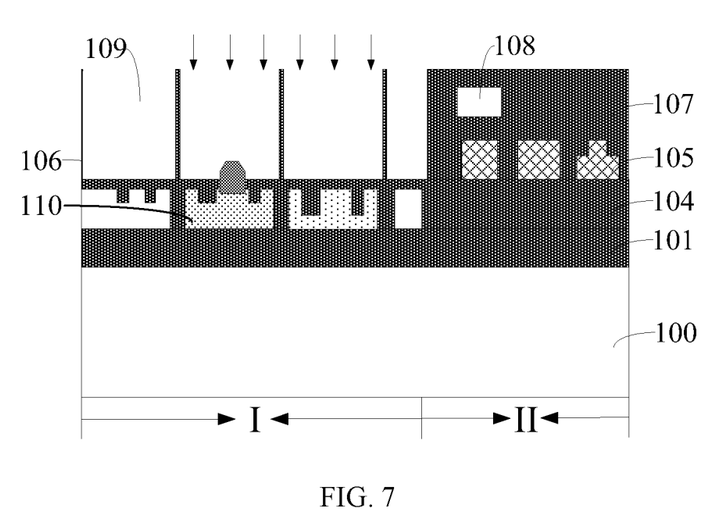

Referring to FIG. 7, after the processing opening 109 is formed, the method further includes: performing an ion injection process in the first region I for multiple times.

In some embodiments, the ion injection process is performed on the plurality of device structures 103 in the first region, such that the plurality of device structures 103 forms an active device 110.

In some embodiments, the active device 110 includes a modulator and a detector. In some other embodiments, the active device 110 may be one of the modulator and the detector.

In some embodiments, an annealing process is required when forming the passive device 105. To prevent the annealing process from heating and diffusing ions implanted in the active device 110 and degrading functions of the active device 110, the active device 110 is formed after the passive device 105 is formed. Through this process arrangement, the active device 110 and the passive device 105 can be formed on a same wafer.

In some embodiments, the active device 110 and the passive device 105 are formed on the same wafer to avoid a packaging and integration process. Thus, production cost is reduced, and a thickness of the formed semiconductor structure is reduced, thereby facilitating the miniaturization of the devices.

Figure 8:
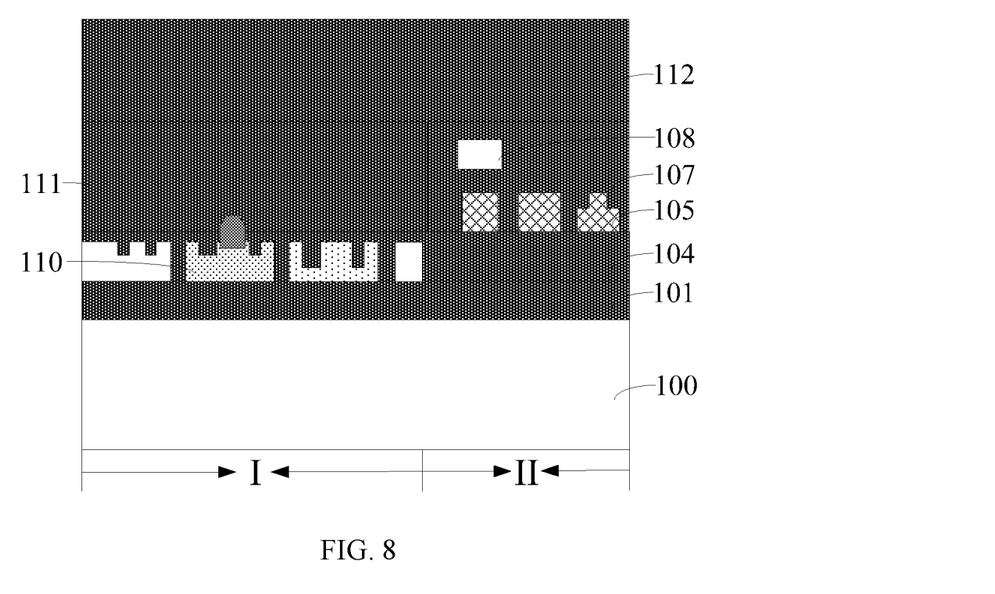

Referring to FIG. 8, after the active device 110 is formed, the method further includes: forming a fourth insulating layer 111 on the active device 110, a top surface of the fourth insulating layer 111 and a top surface of the third insulating layer 107 being evenly leveled; and forming a fifth insulating layer 112 on the third insulating layer 107 and the fourth insulating layer 111.

In some embodiments, forming the fourth insulating layer 111 includes: forming an initial fourth insulating layer (not shown) on the passive device 110 and the third insulating layer 107; and planarizing the initial fourth insulating layer until the top surface of the third insulating layer 107 is exposed to form the fourth insulating layer 111.

In some embodiments, the fourth insulating layer 111 is made of a material based on silicon oxide.

In some embodiments, planarizing the fourth insulating layer 111 includes the chemical mechanical polishing process.

In some embodiments, the fifth insulating layer is made of a material based on silicon oxide.

Figure 9:
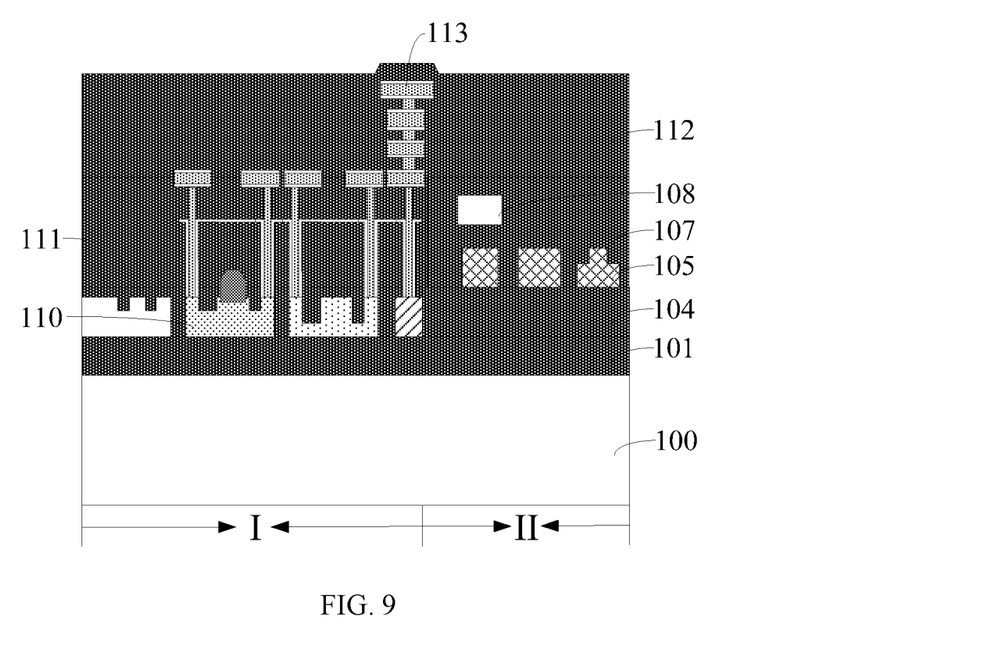

Referring to FIG. 9, after the fifth insulating layer 112 is formed, the method further includes: forming an electrical interconnection structure 113 in the fourth insulating layer 111 and the fifth insulating layer. The electrical interconnection structure 113 is connected to the passive device 110.

In some embodiments, the electrical interconnection structure 113 includes: a conductive layer and a conductive plug (not shown).

Figure 10:
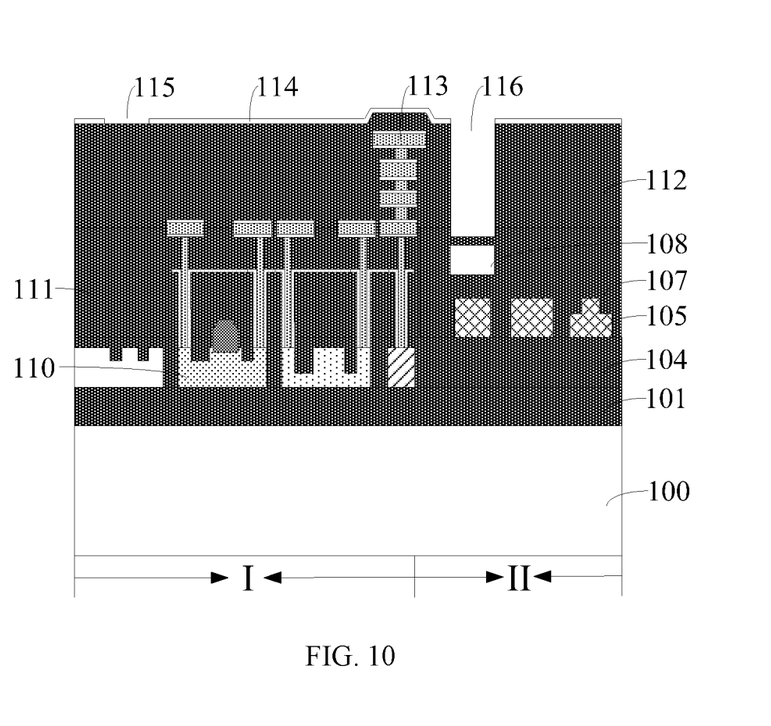
Figure 11:
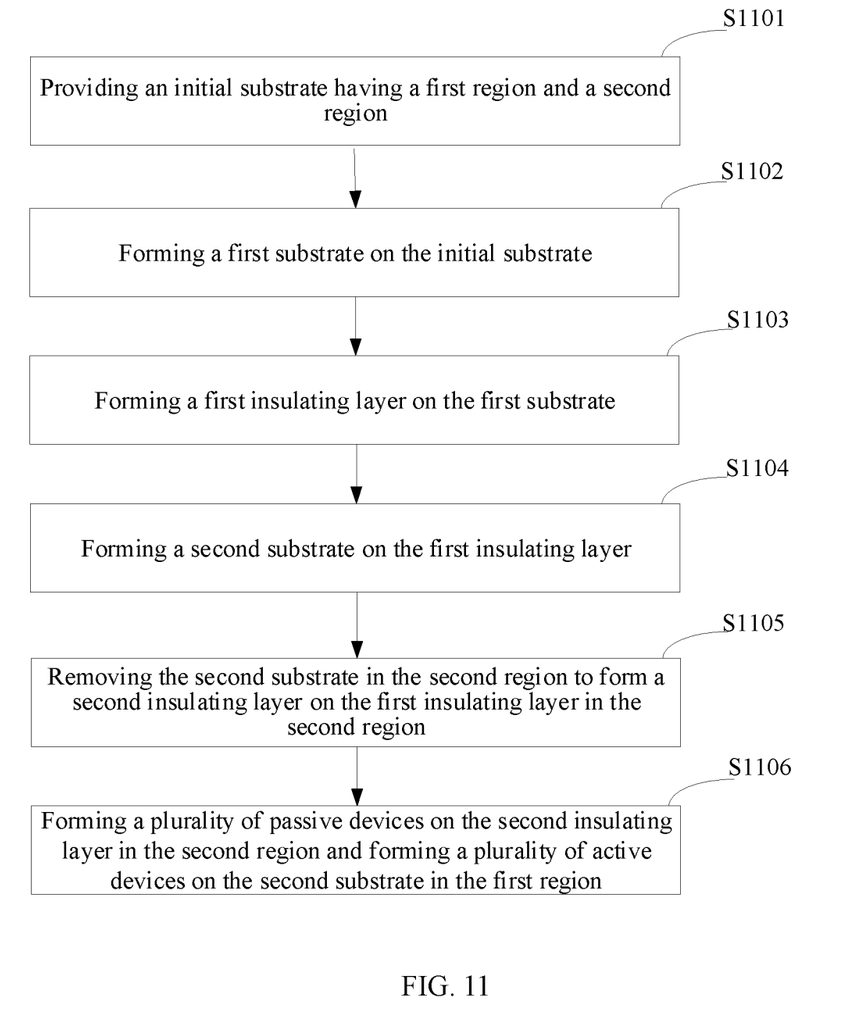
FIG. 11 is a flowchart of an exemplary method of forming the semiconductor structure according to some embodiments of the present disclosure.

Referring to FIG. 10, after the electrical interconnection structure 113 is formed, the method further includes: forming a passivation layer 114 on the fifth insulating layer 112; forming a first light inlet 115 passing through the passivation layer 114, the first light inlet 115 being over the active device 110; and forming a second light inlet 116 passing through the passivation layer 114, the fifth insulating layer 112, and the third insulating layer 107, the second light inlet 116 being over the passive device 105.

In some embodiments, forming the second light inlet 116 includes: removing a portion of the passivation layer 114, the fifth insulating layer 112, and the third insulating layer 107 to form the second light inlet 116.

In some other embodiments, forming the second light inlet 116 includes: removing the grating layer 108, and a portion of the passivation layer 114, the fifth insulating layer 112, and the third insulating layer 107 to form the second light inlet 116.

Correspondingly, the embodiments of the present disclosure also provide a semiconductor structure. Referring to FIG. 10 again, the semiconductor structure includes the substrate. The substrate includes the first region I and the second region II. The substrate includes the first substrate 100, the first insulating layer 101 disposed on the first substrate 100, the second insulating layer 104 disposed on the first insulating layer 101, a plurality of active devices 110 in the first region I, and a plurality of passive device 105 on the second insulating layer 104. The second insulating layer 104 is in the second region II.

In some embodiments, the substrate includes the plurality of active devices 110, and the plurality of pass device 105 on the second insulating layer 114. By forming the plurality of active devices 110 and the plurality of passive devices 105 on the same wafer, the packaging integration process can be avoided, the production cost can be effectively reduced, and the thickness and size of the formed semiconductor structure are reduced, thereby facilitating the miniaturization of the devices.

In some embodiments, the semiconductor structure further includes: the third insulating layer 107 on the plurality of passive devices 105; the fourth insulating layer 111 on the plurality of active devices 110, and the fifth insulating layer 112 on the third insulating layer 107 and the fourth insulating layer 111. The top surface of the fourth insulating layer 111 and the top surface of the third insulating layer 107 are evenly leveled.

In some embodiments, the semiconductor structure further includes: the grating layer 108 in the third insulating layer 107. In some other embodiments, the third insulating layer 107 does not include the grating layer 108.

In some embodiments, the semiconductor structure further includes: the electrical interconnection structure 113 in the fourth insulating layer 111 and the fifth insulating layer 112. The electrical interconnection structure 113 is connected to the plurality of active devices 110.

In some embodiments, the semiconductor structure further includes: the passivation layer 114 on the fifth insulating layer 112; the first light inlet 115 passing through the passivation layer 114 and over the plurality of active devices 110; and the second light inlet 116 passing through the passivation layer 114, the fifth insulating layer 115, and the third insulating layer 107, and over the plurality of passive devices 105.

In some embodiments, the plurality of passive devices 105 is made of a material based on silicon nitride, and the plurality of active devices 110 is made of a material based on silicon. Thus, the optical propagation loss of the plurality of active devices 110 and the plurality of passive devices 105 is reduced.

In some embodiments, the plurality of active devices 110 includes the modulator and the detector. In some other embodiments, the plurality of active devices 110 may include one of the modulator and the detector.

In some embodiments, the plurality of passive devices 105 is the waveguide device.

The above description of the disclosed embodiments enables those skilled in the art to implement or use this application. Various modifications to these embodiments will be obvious to those skilled in the art, and the general principles defined herein can be implemented in other embodiments without departing from the spirit or scope of the present application. Therefore, this application will not be limited to the embodiments shown in the specification, but should conform to the broadest scope consistent with the principles and novelties disclosed in the specification.

What is claimed is:

1. A semiconductor structure, comprising:
   a substrate having a first region and a second region;
   a first insulating layer on the substrate;
   a second insulating layer on the first insulating layer in the second region;
   a plurality of active devices on the first insulating layer in the first region;
   a plurality of passive devices on the second insulating layer;
   a third insulating layer on the plurality of passive devices;
   a fourth insulating layer on the plurality of active devices, a top surface of the fourth insulating layer being leveled with a top surface of the third insulating layer; and
   a fifth insulating layer on the third insulating layer and the fourth insulating layer.

2. The semiconductor structure according to claim 1, further comprising:
   a grating layer in the third insulating layer.

3. The semiconductor structure according to claim 1, further comprising:
   an electrical interconnection structure connecting to an active device of the plurality active devices.

4. The semiconductor structure according to claim 1, further comprising:
a passivation layer on the fifth insulating layer;
a first light inlet passing through the passivation layer and over the plurality of active devices; and
a second light inlet passing through each of the passivation layer, the fifth insulating layer, and the third insulating layer, and over the plurality of passive devices.

5. The semiconductor structure according to claim 1, wherein:
the plurality of passive devices are made of a material based on silicon nitride; and/or
the plurality of active devices are made of a material based on silicon.

6. The semiconductor structure according to claim 1, wherein:
the plurality of active devices include at least one of a modulator or a detector; and/or
the plurality of passive devices include a waveguide device.

7. A method of forming a semiconductor structure, comprising:
providing an initial substrate having a first region and a second region;
forming a first substrate on the initial substrate;
forming a first insulating layer on the first substrate;
forming a second substrate on the first insulating layer;
removing the second substrate in the second region to form a second insulating layer on the first insulating layer in the second region; and
forming a plurality of passive devices on the second insulating layer in the second region and forming a plurality of active devices on the second substrate in the first region.

8. The method of forming the semiconductor structure according to claim 7, wherein forming the plurality of passive devices includes:
forming a passive device material layer on the second insulating layer;
performing a first patterning process on the passive device material layer for multiple times to form a plurality of initial passive devices; and
performing an annealing process on the plurality of initial passive devices to form the plurality of passive devices, wherein an annealing temperature in the annealing process is higher than 1000° C.

9. The method of forming the semiconductor structure according to claim 8, wherein:
the plurality of passive devices are made of a material based on silicon nitride; and/or
the second substrate are made of a material based on silicon.

10. The method of forming the semiconductor structure according to claim 7, wherein:
the plurality of active devices include at least one of a modulator or a detector.

11. The method of forming the semiconductor structure according to claim 8, wherein forming the plurality of active devices includes:
forming a plurality of device structures in the first region; and
performing an ion injection process in the first region for multiple times.

12. The method of forming the semiconductor structure according to claim 11, wherein:
the plurality of device structures include at least one of a gate structure or an epitaxial layer in the second substrate.

13. The method of forming the semiconductor structure according to claim 11, further comprising while forming the plurality of initial passive devices:
forming a plurality of barrier layers on the plurality of device structures.

14. The method of forming the semiconductor structure according to claim 11, wherein the ion injection process includes:
forming a third insulating layer on the plurality of passive devices and the plurality of barrier layers;
removing a portion of the third insulating layer and the plurality of barrier layers to form a processing opening in the third insulating layer, the processing opening being over the plurality of device structures; and
injecting ions into the plurality of device structures to form the plurality of active devices.

15. The method of forming the semiconductor structure according to claim 14, wherein:
the third insulating layer includes a grating layer.

16. The method of forming the semiconductor structure according to claim 15, further comprising after the plurality of active devices are formed:
forming an electrical interconnection structure over the plurality of active devices.

17. The method of forming the semiconductor structure according to claim 16, further comprising after the plurality of active devices are formed:
forming a fourth insulating layer on the plurality of active devices, a top surface of the fourth insulating layer being leveled with a top surface of the third insulating layer; and
forming a fifth insulating layer on the third insulating layer and the fourth insulating layer, the electrical interconnection structure being in the fourth insulating layer and the fifth insulating layer.

18. The method of forming the semiconductor structure according to claim 17, further comprising after the plurality of active devices are formed:
forming a passivation layer on the fifth insulating layer;
forming a first light inlet passing through the passivation layer, the first light inlet being over the plurality of active devices; and
forming a second light inlet passing through the passivation layer, the fifth insulating layer, and the third insulating layer, the second light inlet being over the plurality of passive devices.

19. The method of forming the semiconductor structure according to claim 18, wherein forming the second light inlet includes:
removing a portion of the passivation layer, the fifth insulating layer, the third insulating layer to form the second light inlet.

* * * * *